United States Patent
Loete et al.

(10) Patent No.: US 10,184,971 B2
(45) Date of Patent: Jan. 22, 2019

(54) METHOD FOR MARKING BUNDLES OF POWER LINES FOR DIAGNOSIS BY REFLECTOMETRY AND CORRESPONDING KIT

(71) Applicants: CENTRE NATIONAL DE LA RECHERCHE SCIENTIFIQUE—CNRS, Paris (FR); ECOLE SUPERIEURE D'ELECTRICITE, Gif sur Yvette (FR); INRIA—INSTITUT NATIONAL DE LA RECHERCHE EN INFORMATIQUE ET EN AUTOMATIQUE, Le Chesnay (FR)

(72) Inventors: Florent Loete, Massy (FR); Michel Sorine, Sartrouville (FR)

(73) Assignees: CENTRE NATIONAL DE LA RECHERCHE SCIENTIFIQUE—CNRS, Paris (FR); CENTRALESUPELEC, Gif sur Yvette (FR); INRIA—INSTITUT NATIONAL DE LA RECHERCHE EN INFORMATIQUE ET EN AUTOMATIQUE, Le Chesnay (FR)

( * ) Notice: Subject to any disclaimer, the term of this patent is extended or adjusted under 35 U.S.C. 154(b) by 29 days.

(21) Appl. No.: 15/320,092

(22) PCT Filed: Jun. 19, 2015

(86) PCT No.: PCT/FR2015/051628
§ 371 (c)(1),
(2) Date: Dec. 19, 2016

(87) PCT Pub. No.: WO2015/193626
PCT Pub. Date: Dec. 23, 2015

(65) Prior Publication Data
US 2017/0153284 A1 Jun. 1, 2017

(30) Foreign Application Priority Data

Jun. 20, 2014 (FR) .................... 14 55748

(51) Int. Cl.
*G01R 31/11* (2006.01)
*G01R 31/00* (2006.01)
*G01R 31/08* (2006.01)

(52) U.S. Cl.
CPC ............ *G01R 31/11* (2013.01); *G01R 31/008* (2013.01); *G01R 31/086* (2013.01)

(58) Field of Classification Search
CPC .. G01R 31/005; G01R 31/006; G01R 31/008; G01R 31/11
(Continued)

(56) References Cited

U.S. PATENT DOCUMENTS

2004/0183680 A1    9/2004 Thompson et al.
2005/0234666 A1*  10/2005 Taylor .................. H04B 17/103
                                                          702/66
(Continued)

FOREIGN PATENT DOCUMENTS

FR      2 964 746 A1    3/2012
WO   2010/043602 A1    4/2010

OTHER PUBLICATIONS

International Search Report, dated Oct. 7, 2015, from corresponding PCT application.

*Primary Examiner* — Tung X Nguyen
*Assistant Examiner* — Robert P Alejnikov, Jr.
(74) *Attorney, Agent, or Firm* — Young & Thompson

(57) ABSTRACT

Disclosed is a method for diagnosis by reflectometry of a bundle of power lines including an input point and a plurality of branches, including the following steps: inserting (S50) electric markers having different frequency characteristics onto the branches of the bundle; injecting (S52) a (Continued)

test signal into the bundle from the input point; receiving (S54) a set of reflected signals produced by reflections of the test signal in the branches; analyzing all the reflected signals by identifying the markers and by assigning (S56) each reflected signal to one of the branches according to the frequency characteristic of the marker inserted onto the branch; and identifying the presence/absence of a defect in the branch by comparing (S58) the reflected signal assigned to the branch with a reflected signal model obtained by modelling the reflection of the test signal in the branch in the absence of any defect in the branch.

15 Claims, 2 Drawing Sheets

(58) Field of Classification Search
USPC .................................. 324/503, 533, 534
See application file for complete search history.

(56) References Cited

U.S. PATENT DOCUMENTS

| 2006/0043976 | A1* | 3/2006 | Gervais | G01R 31/021 |
| | | | | 324/508 |
| 2010/0141264 | A1* | 6/2010 | Ravot | G01R 31/11 |
| | | | | 324/533 |
| 2011/0153235 | A1* | 6/2011 | Thomas | G01R 31/024 |
| | | | | 702/59 |
| 2011/0227582 | A1* | 9/2011 | Ahamed | G01R 31/11 |
| | | | | 324/533 |
| 2011/0307197 | A1  | 12/2011 | Lelong | |
| 2013/0173187 | A1* | 7/2013 | Sommervogel | G01R 31/11 |
| | | | | 702/58 |
| 2013/0200904 | A1* | 8/2013 | Millet | G01R 31/11 |
| | | | | 324/533 |

* cited by examiner

METHOD FOR MARKING BUNDLES OF POWER LINES FOR DIAGNOSIS BY REFLECTOMETRY AND CORRESPONDING KIT

FIELD OF THE INVENTION

The present invention relates to methods for diagnosing bundles of electrical lines by reflectometry, and the corresponding kits.

More particularly, the invention relates to a method for diagnosing, by reflectometry, a bundle of electrical lines which has at least one input point and a plurality of branches, such a bundle of electrical lines in a branching arrangement, and a kit for diagnosing such a bundle by reflectometry.

BACKGROUND OF THE INVENTION

Complex interconnected electronic systems are increasingly present in our daily lives, and their failure can have serious consequences in human, economic, and social terms, especially for critical applications requiring reliable operation.

It is for this reason that wire networks are now regarded as critical systems and their diagnosis is beginning to be a consideration in industry.

With the rise in total cable length (about 4 km in modern cars and up to 400 km in passenger aircraft) and the increasing sensitivity to network faults because of design complexities, various problems due to electrical cables may arise at the system level.

Network diagnosis is therefore essential for detecting and locating these faults.

Today, for example, a mechanic may take up to two days to find and repair a wiring fault, sometimes after changing healthy and costly components (ECU, connector, etc.). For example, 70% of the ECUs returned to the manufacturer are free of faults.

In the field of aeronautics, the operating loss from an AOG (Aircraft On Ground) grounded for repair is close to €1 to 2 million per day.

At present, the most promising and most widely used technique for diagnosing wiring harnesses or bundles is reflectometry.

Reflectometry is based on a technique similar to that of a radar system.

In particular, a wide spectral band signal is injected into the bundle and a portion of the signal is reflected back to the point of injection by each area having a variation in the characteristic impedance of the line (discontinuity, for example) that is encountered by the signal. Of course, in the following, the term "reflected" is understood to mean one or more electrical signals returned by the transmission medium used to transmit the wide spectral band signal.

This produces a series of echoes whose amplitudes depend on the topology of the bundle and on the faults that may be present therein. Analysis of these amplitudes allows identifying the nature of the faults: whether they are hard faults, such as open circuits or short circuits, or soft faults (localized but regular variations from the characteristic impedance).

Analysis of the return time of echoes at the injection site provides information about the position of faults in the bundle.

Document US 2011/0153235 provides a method for detecting faults in wiring by graphically modeling the expected responses and performing a comparison to actual responses. In FIGS. 8 and 9 of that document, reference 902 indicates the detection of a difference exceeding a threshold, representative of a fault. In practice, however, when the bundle has multiple divisions, it may not be easy to pinpoint the fault location.

In any event, ambiguity remains concerning the position of the fault in many cases. For example, if a fault occurs beyond a splice, in other words beyond a division of the bundle into multiple branches, it is impossible to find the right branch quickly and simply when using measurements at a single point. This ambiguity is a problem during maintenance and repair, with an economic impact that can be significant for some areas of application.

Document WO 2010/043602 A1 discloses a method of distributed reflectometry that eliminates ambiguity when locating a fault in a complex bundle, by multiplying the measurement points in the network. More particularly, the complete reflectometry system (signal generation, acquisition, processing) is duplicated in order to inject a signal at the ends of the cable bundle. A diagnosis is therefore made from each end.

In the embedded case, the system is duplicated at each end. In the case of manual intervention, the ambiguity is only eliminated after multiple operations, such as the additional removal of vehicle trim elements by the technician. This method also requires communication in order to synchronize measurements between the various units.

All of this means a considerable loss of time and money.

OBJECTS OF THE INVENTION

The present invention aims to overcome these disadvantages.

For this purpose, a method of the type in question is characterized in that it comprises the following steps:
inserting electrical tags in the branches of the bundle, the electrical tags having frequency characteristics that differ from one another;
injecting a test signal into the bundle from the input point;
receiving a set of reflected signals produced by reflections of the test signal in the branches of the bundle;
analyzing the set of reflected signals by identifying the electrical tags and assigning each reflected signal to one of the bundle branches based on the frequency characteristic of the electrical tag inserted in said branch; and
identifying the presence/absence of a fault in said branch by comparing the reflected signal assigned to said branch to a reflected signal model obtained by modeling the reflection of the test signal in said branch in the absence of any faults in said branch.

With these arrangements, it is possible to eliminate location ambiguity between different branches of a wiring network of complex topology in a simple and inexpensive manner when locating faults by reflectometry, by electrically tagging the branches of the network with specific frequency signatures without disrupting the normal operation of the network.

"Electrical tag" is understood here to mean a component which may typically be devoid of communication means (no RFID chip, antenna, or analog communication) and/or data storage. Electrical tags are passive and create a marker that is simply electrical. Such tags can be inserted into the branches, when they are not provided in the design of the electrical lines. The term "inserted" for an electrical tag therefore means, of course, that the tag will be added between two successive sections of the branch or at an end as an extension of the branch.

In various embodiments of the method according to the invention, one or more of the following arrangements may possibly be used:
- the electrical tags comprise electrical dipoles and/or quadripoles which are linear and/or nonlinear, passive and/ or active;
- the electrical tags comprise low-pass filters;
- at least some of the low-pass filters have different cutoff frequencies;
- at least some of the low-pass filters have different cutoff slopes;
- at least some of the low-pass filters are first-order low-pass filters;
- at least some of the low-pass filters are second-order low-pass filters;
- the injection step is carried out by a test signal generation module comprising a digital-to-analog converter and an injection coupling member; and
- the receiving step is carried out by an electrical signal detection module comprising a reception coupling member and an analog-to-digital converter.

The invention also relates to a bundle of electrical lines which has at least one input point and a plurality of branches, characterized in that it comprises a plurality of electrical tags each inserted in one of the branches of the bundle, the electrical tags having frequency characteristics that differ from one another.

In various embodiments of the bundle according to the invention, one or more of the following arrangements may possibly be used:
- each electrical tag has an impedance equal to a characteristic impedance of the branch in which it is inserted, at least for electrical signal frequencies corresponding to the operating frequencies of the bundle (E); and
- the bundle is equipment for a land, air, or space vehicle, or for a vehicle for sea or river transport, suitable for service on board the vehicle.

The invention further relates to a kit for diagnosis, by reflectometry, of a bundle of electrical lines which has at least one input point and a plurality of branches, characterized in that it comprises:
- a plurality of electrical tags each adapted for insertion in one of the branches of the bundle (E), the electrical tags having frequency characteristics that differ from one another;
- a test signal generation module adapted for connection to the input point and for injecting a test signal into the bundle from the input point;
- an electrical signal detection module adapted for connection to the input point and for receiving a series of reflected signals produced by reflections of the test signal in the branches of the bundle; and
- a processing module adapted for connection to the detection module and for analyzing the set of reflected signals by identifying the electrical tags and assigning each reflected signal to one of the branches of the bundle based on the frequency characteristic of the electrical tag inserted in said branch, and for identifying the presence/absence of a fault in said branch by comparing the reflected signal assigned to said branch to a reflected signal model obtained by modeling the reflection of the test signal in said branch in the absence of any fault in said branch.

BRIEF DESCRIPTION OF DRAWINGS

The invention will be better understood by reading the following description of one of its embodiments, given purely by way of non-limiting example with reference to the accompanying drawings, in which.

MORE DETAILED DESCRIPTION

In the various figures, the same references designate identical or similar elements.

Figure 1:
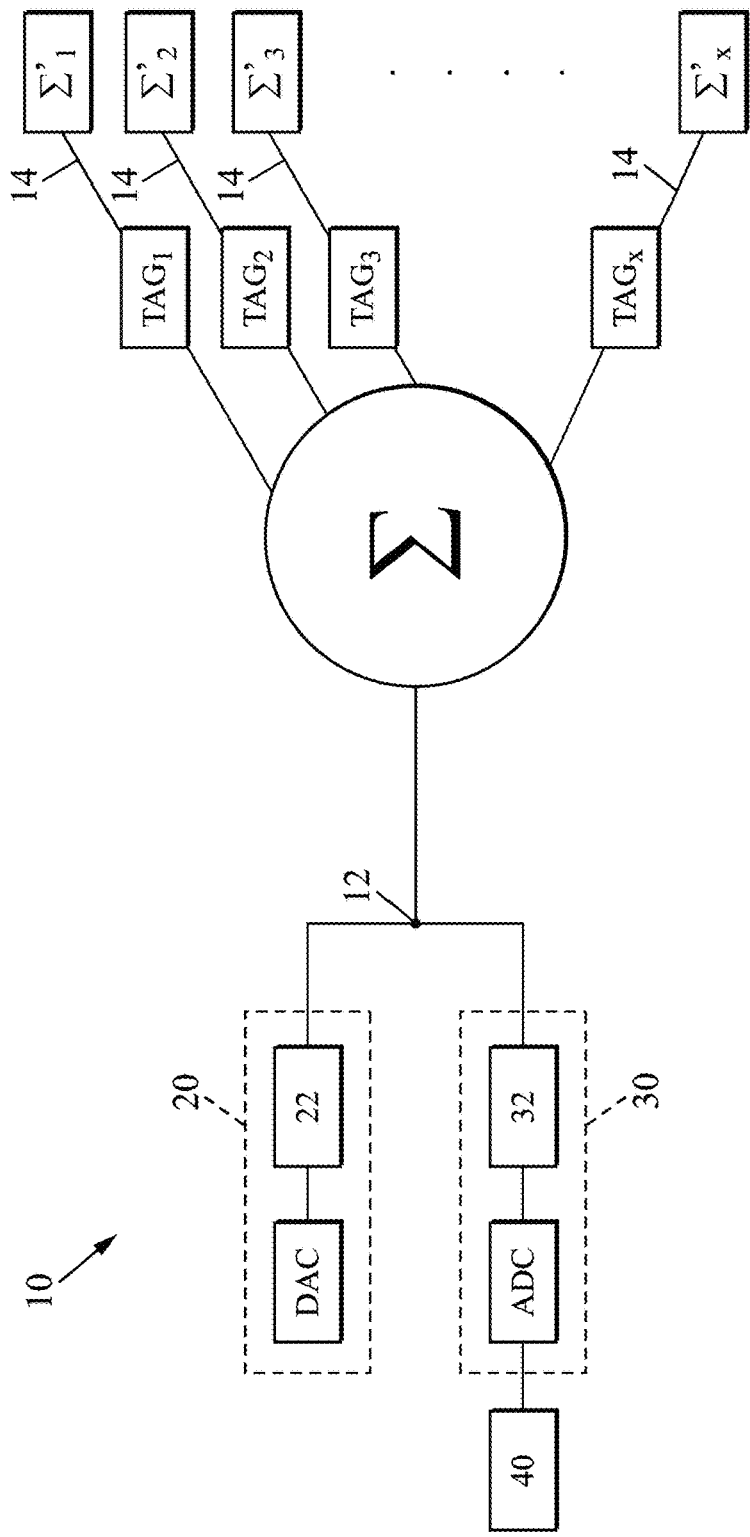
FIG. 1 is a diagram showing a device for diagnosis by reflectometry, according to the invention.

FIG. 1 illustrates a device 10 for diagnosis, by reflectometry, of a bundle Σ of electrical lines.

The bundle Σ has a complex topology and comprises at least one input point 12 and a plurality of branches 14.

Each branch 14 is connected to a system $\Sigma'_x$ having its own individual impedance $Z_x$.

The device 10 comprises a plurality of electrical tags $TAG_X$ each inserted in one of the branches 14 of the bundle Σ.

Each electrical tag $TAG_X$ has a known frequency characteristic, or frequency signature, specific to it, all the frequency characteristics being different from one another.

Figure 2:
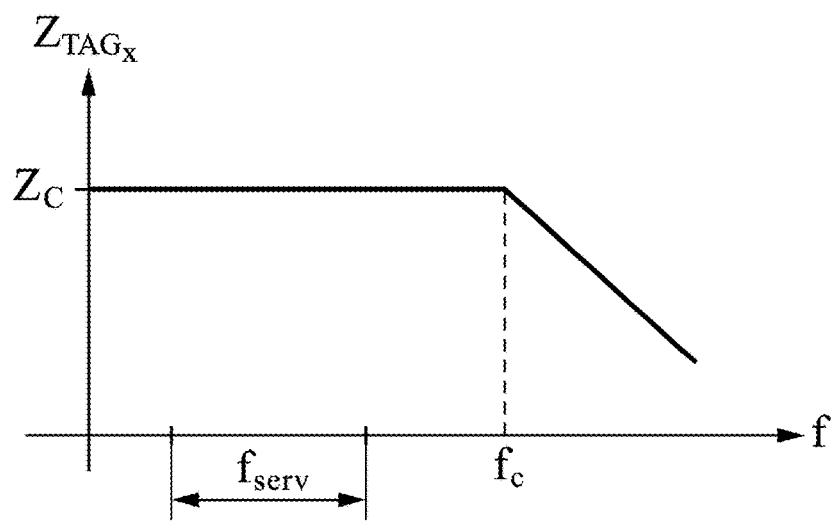
FIG. 2 is a diagram representing a frequency characteristic of an electrical tag of FIG. 1.

In particular and as represented in FIG. 2, each electrical tag $TAG_X$ has an impedance $Z_{TAGx}$ equal to a characteristic impedance $Z_c$ of the branch 14 in which it is inserted, at least for electrical signal frequencies f corresponding to the operating frequencies $f_{serv}$ of the bundle Σ. Thus, the presence of electrical tags $TAG_X$ does not interfere with the working signals conveyed by the bundle Σ during a use of the bundle corresponding to its function when in service.

In other words, the impedance $Z_{TAGx}$ is adapted to the characteristic impedance $Z_c$ of the branch 14 in which it is inserted, in the relevant frequency band(s).

Meaning that the electrical tags $TAG_X$ are "transparent" in the spectral band(s) of the relevant signals of the bundle Σ.

Alternatively, the impedance $Z_{TAGx}$ of the electrical tag $TAG_X$ may be equal to an impedance of an input stage of the system $\Sigma'_x$, at the frequencies of the working signals of the bundle Σ.

The electrical tags $TAG_x$ may comprise electrical dipoles and/or quadripoles which are linear and/or nonlinear, passive and/or active, in particular filters. It is understood that the electrical tags may be without any auxiliary electrical power source (if passive tags).

For the applications considered here, the working signals are generally signals of low and medium frequency.

Electrical tags $TAG_x$ may thus comprise low-pass filters, such as first-order low-pass filters and second-order low-pass filters, and more generally nth-order low-pass filters.

Even more generally, the electrical tags may comprise any filter whose presence is detectable.

To differentiate these from one another, at least some of these low-pass filters may have different cut-off frequencies and/or different cut-off slopes. In FIG. 2, $f_c$ represents the cutoff frequency of the low-pass filter $TAG_x$. This cut-off frequency $f_c$ is different from the operating frequencies $f_{serv}$ of the bundle Σ.

The electrical tags $TAG_x$ may be inserted anywhere in the corresponding branch 14, for example at the beginning, middle, or end, or may be integrated into the input stage of the corresponding system $\Sigma'_x$.

In FIG. 1, the electrical tags $TAG_x$ are inserted in the last branches 14 of the bundle Σ, but it is of course possible to insert them in any branches, for example in the next-to-last branches and more generally in the $n^{th}$ branches of the bundle $\Sigma$. In these cases, the systems $\Sigma'_x$ are not individually isolated but assemblies of systems $\Sigma'_x$, are isolated.

The device 10 further comprises a test signal generation module 20 adapted for connection to the input point 12 and for injecting a test signal into the bundle $\Sigma$ from the input point 12.

The generation module 20 comprises, for example, a digital-to-analog converter DAC connected to an injection coupling member 22 which in turn is connected to the input point 12.

The test signal is a multifrequency signal of wide spectral band, typically a pulse. The test signal preferably has non-zero spectral components within a wide spectral range that contains the cutoff frequencies of all the electrical tags.

The device 10 further comprises a detection module 30 for detecting electrical signals, adapted for connection to the input point 12 and for receiving a set of reflected signals produced by reflections of the test signal in the branches 14 of the bundle $\Sigma$.

The detection module 30 comprises, for example, a reception coupling member 32 connected to the input point 12 and an analog-to-digital converter ADC connected to the reception coupling element 32.

The device 10 also comprises a processing module 40 adapted for connection to the detection module 30 and for analyzing the set of reflected signals.

The invention relates to embedded devices as well as non-embedded devices.

The embedded device comprises at least the bundle $\Sigma$ with its input point 12 and branches 14, and the electrical tags $TAG_X$ permanently inserted in the branches 14.

It may equip a land vehicle (car, bus, etc.), air vehicle (plane, helicopter, etc.), or space vehicle (rocket, satellite, etc.), or a vehicle for sea or river transport (surface or underwater).

The non-embedded device may consist of a kit for diagnosis by reflectometry, comprising the electrical tags $TAG_X$, the generation module 20, the reception module 30, and the processing module 40.

Figure 3:
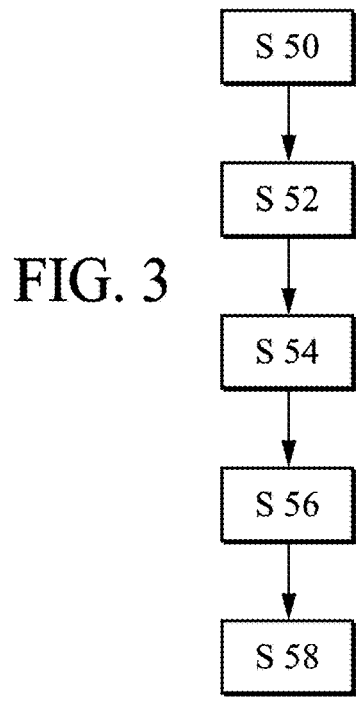
FIG. 3 is a diagram illustrating the different steps of a method for diagnosis by reflectometry according to the invention.

Referring to FIG. 3, the method for diagnosis of the bundle $\Sigma$ by reflectometry comprises the following steps.

A first step S50 consists of inserting the electrical tags $TAG_X$ in the branches 14 of the bundle $\Sigma$.

It should be noted that in the case of an embedded device, this step was already implemented during manufacture of the bundle $\Sigma$ or its installation in the vehicle.

Next, in a step S52 carried out by the generation module 20, a test signal is injected into the bundle $\Sigma$ from the input point 12.

A portion of the test signal is then reflected in the various branches 14, generating reflected signals.

All of these reflected signals are then received by the detection module 30 in a step S54, and are then analyzed by the processing module 40.

In particular, the processing module 40 identifies the electrical tags, and in a step S56 assigns each reflected signal to one of the branches 14 based on the frequency characteristic of the electrical tag $TAG_X$ inserted in this branch 14.

The processing module 40 then, in a step S58, compares each reflected signal assigned to a branch 14 to a signal model obtained by modeling the reflection of the test signal in the corresponding branch 14 when there is no fault in that branch 14.

The model of course takes into account the frequency signatures of the electrical tags $TAG_X$ and the complex topology of the bundle $\Sigma$.

Based on the results of this comparison, it is then possible to identify the presence or absence of a fault in the branch 14.

The invention thus provides a method and devices, embedded or non-embedded, which are inexpensive and simple to implement and which allow unambiguously identifying and locating a fault in a line by electrically tagging with the use of filters each of the branches of a bundle with a particular frequency signature.

In addition, the electrical tags considered in the invention do not interfere with the working signals carried by the bundle.

The more complex the structure of the tags, or in other words the more specific the frequency signature of the tags, the easier it will be to assign the reflected signals to the respective branches. The cost of a filter depends on its complexity but still remains well below that of a complete reflectometry system.

The invention applies in particular to electrical bundles playing a critical role in terms of operational safety, particularly in the field of transport (automobiles but especially aeronautics), nuclear energy, and power distribution networks (monitoring for wire theft).

Of course, the invention can be applied to make a diagnosis when a fault is detected in a network or simply to perform a diagnostic test in order to check the network status.

The analysis of the reflected signals which is performed by the processing module was described above in the frequency domain (Frequency Domain Reflectometry—FDR). In such a spectral analysis, the reflection coefficient at the input point of the bundle, therefore the injection point of the test signal, is affected by the frequency signatures of the electrical tags.

However, in an equivalent manner the processing module may perform a temporal analysis of the reflected signals (Time Domain Reflectometry—TDR). In this case, each echo from a tagged branch is convolved with the impulse response of the corresponding electrical tag. The transformation from one to the other and vice versa is respectively done by inverse Fourier transform and Fourier transform.

Those skilled in the art will understand that the invention follows the principle of inserting different tags in separate branches of the bundle, so that the signal reflected by one of the branches can be identified as definitely coming from that branch. Any alteration of the reflected signal indicates that a fault is present in that branch. However, the invention is compatible with a plurality of modes for analyzing reflected signals which the skilled person will know how to implement without difficulty.

The invention claimed is:

1. A method for diagnosing, by reflectometry, a bundle of electrical lines which has at least one input point and a plurality of branches, the method comprising:
    inserting passive electrical tags in the branches of the bundle, the passive electrical tags having frequency characteristics that differ from one another;
    injecting a test signal into the bundle from a given input point that forms a common input for all the branches of the bundle;
    receiving, at the given input point, a set of reflected signals produced by reflections of the test signal in the branches of the bundle;

analyzing the set of reflected signals by identifying the passive electrical tags and assigning each reflected signal to one of the branches of the bundle based on the frequency characteristic of the passive electrical tag inserted in said branch; and identifying the presence/absence of a fault in said branch by comparing the reflected signal assigned to said branch to a reflected signal model obtained by modeling the reflection of the test signal in said branch in the absence of any faults in said branch.

2. The method according to claim 1, wherein the passive electrical tags comprise electrical dipoles and/or quadripoles that are linear and/or nonlinear.

3. The method according to claim 2, wherein at least some of the low-pass filters are second-order low-pass filters.

4. The method according to claim 1, wherein the passive electrical tags comprise low-pass filters.

5. The method according to claim 4, wherein at least some of the low-pass filters have different cutoff frequencies.

6. The method according to claim 4, wherein at least some of the low-pass filters have different cut-off slopes.

7. The method according to claim 4, wherein at least some of the low-pass filters are first-order low-pass filters.

8. The method according to claim 1, wherein the test signal is produced by a test signal generation module that comprises:
a digital-to-analog converter, and
an injection coupling member.

9. The method according to claim 1, wherein the set of reflected signals is received by an electrical signal detection module that comprises:
a reception coupling member, and
an analog-to-digital converter.

10. A bundle of electrical lines which has an input point and a plurality of branches, comprising a plurality of passive electrical tags each inserted in one of the branches of the bundle, the branches provided with a respective one of the passive electrical tags being marked branches associated to the input point,
wherein the passive electrical tags have frequency characteristics that differ from one another, so that the respective frequency characteristics allow characterizing one marked branch relative to the others by internal reflections in the bundle that are induced by a test signal injected from the input point during a diagnosis by reflectometry.

11. The bundle according to claim 10, wherein each passive electrical tag has an impedance equal to a characteristic impedance of the branch in which it is inserted, at least for electrical signal frequencies corresponding to operating frequencies of the bundle.

12. The bundle according to claim 10, the bundle being an equipment for land, air, or space vehicle, or for a vehicle for sea or river transport, suitable for service on board the vehicle.

13. The bundle according to claim 10, wherein the passive electrical tags are each selected from the group which includes:
electrical dipoles and/or quadripoles that are linear and/or nonlinear; and
low-pass filters.

14. A kit for diagnosis, by reflectometry, of a bundle of electrical lines which has an input point and a plurality of branches, comprising:
a plurality of passive electrical tags each adapted for insertion in one of the branches of the bundle, the passive electrical tags having frequency characteristics that differ from one another and are adapted to transfer a signature in reflected signals produced in the branches by reflections of a test signal during a diagnosis by reflectometry;
a test signal generation module adapted for connection to the input point and for injecting a test signal into the bundle from the input point, the input point forming a common input for the plurality of branches;
a detection module for detecting electrical signals, adapted for connection to the input point and for receiving a set of reflected signals produced by reflections of the test signal in the branches of the bundle; and
a processing module adapted for connection to the detection module and for analyzing the set of reflected signals by identifying the passive electrical tags and assigning each reflected signal to one of the branches of the bundle based on the frequency characteristic of the passive electrical tag inserted in said branch, and for identifying a presence/absence of a fault in said branch by comparing the reflected signal assigned to said branch to a reflected signal model obtained by modeling the reflection of the test signal in said branch in the absence of any fault in said branch.

15. The kit according to claim 14, wherein the passive electrical tags are each selected from the group which includes:
electrical dipoles and/or quadripoles that are linear and/or nonlinear; and
low-pass filters.

* * * * *